(12) United States Patent
Lee et al.

(10) Patent No.: US 8,455,309 B2
(45) Date of Patent: Jun. 4, 2013

(54) METHOD FOR MANUFACTURING A SEMICONDUCTOR DEVICE

(75) Inventors: Song-Ju Lee, Gyeonggi-do (KR); Jeong Soo Park, Gyronggi-do (KR); Byung-Gook Park, Seoul (KR); Hyun Woo Kim, Daegu (KR)

(73) Assignees: Hynix Semiconductor Inc., Icheon-Si (KR); SNU R&DB Foundation, Seoul (KR)

( * ) Notice: Subject to any disclaimer, the term of this patent is extended or adjusted under 35 U.S.C. 154(b) by 0 days.

(21) Appl. No.: 13/347,361

(22) Filed: Jan. 10, 2012

(65) Prior Publication Data

US 2013/0102114 A1    Apr. 25, 2013

(30) Foreign Application Priority Data

Oct. 25, 2011 (KR) .......................... 10-2011-0109571

(51) Int. Cl.
*H01L 33/08* (2010.01)

(52) U.S. Cl.
USPC ............ 438/151; 257/E29.279; 257/E21.433; 257/E21.434; 257/E21.621; 257/E21.635

(58) Field of Classification Search
USPC .................. 257/E29.279, E21.433, E21.434, 257/E21.621, E21.635
See application file for complete search history.

(56) References Cited

U.S. PATENT DOCUMENTS

| | | | |
|---|---|---|---|
| 6,747,313 B1 * | 6/2004 | Gil ................................ | 257/329 |
| 2008/0290422 A1 * | 11/2008 | Nowak .......................... | 257/384 |
| 2011/0114918 A1 * | 5/2011 | Lin et al. ........................ | 257/24 |

* cited by examiner

*Primary Examiner* — Benjamin Sandvik
*Assistant Examiner* — Rodolfo Fortich

(57) ABSTRACT

A technology is capable of simplifying a process of manufacturing an asymmetric device in forming a Tunneling Field Effect Transistor (TFET) structure. A method for manufacturing a semiconductor device comprises forming a conductive pattern over a semiconductor substrate, implanting impurity ions with the conductive pattern as a mask to form a first junction region in the semiconductor substrate, forming a first insulating film planarized with the conductive pattern over the first junction region, etching the top of the conductive pattern to expose a sidewall of the first insulating film, forming a spacer at the sidewall of the first insulating film disposed over the conductive pattern, etching the conductive pattern with the spacer as an etching mask to form a gate pattern, and forming a second junction region in the semiconductor substrate with the gate pattern as a mask.

18 Claims, 5 Drawing Sheets

METHOD FOR MANUFACTURING A SEMICONDUCTOR DEVICE

CROSS-REFERENCE TO RELATED APPLICATION

The present application claims priority to Korean patent application No. 10-2011-0109571 filed on Oct. 25, 2011, which is incorporated by reference in its entirety.

BACKGROUND OF THE INVENTION

1. Technical Field

The present invention relates generally to a method for manufacturing a semiconductor device, and more particularly to a method for manufacturing a semiconductor device that comprises a tunneling field effect transistor.

2. Related Art

Recently, the problem of power consumption has surfaced as the channel length of MOSFET becomes smaller with a nano-scale. As a result, a supply voltage Vdd should be lowered in order to reduce power consumption. However, lowering the supply voltage may sharply increase a leakage current below a threshold voltage. Thus, a lot of research has been conducted on a new transistor structure to reduce the supply voltage, and one of the structures is a Tunneling Field Effect Transistor (TFET).

FIG. 1 is a diagram illustrating a general n-channel TFET structure.

As shown in FIG. 1, a conventional TFET structure is a MOS-gated pin diode structure. In an OFF state, a barrier between a source and a channel is too high so that electrons in the source cannot move into the channel. That is, since it is impossible for electrons to be tunneling in the OFF state, a small leakage current exists. Meanwhile, if a voltage that is greater than a threshold voltage is applied to a gate at an ON state, the barrier between the source and the channel becomes low enough that the electrons can tunnel and a current may flow. Thus, the conventional TFET structure has come into the spotlight as a structure for increasing an ON/OFF rate by reducing the leakage current. However, because of high tunneling resistance, a driving current is too low to obtain a better switching characteristic in the conventional TFET structure.

Referring to FIG. 1, the conventional TFET structure comprises a gate insulating film 20 disposed over a p-type substrate 10 and a gate 30 disposed over the gate insulating film 20. A source region 40 is formed of a p+ doping layer, and a drain region 50 is formed of an n+ doping layer. Since the conventional TFET structure is asymmetrically formed, it is difficult to form the source and drain by a self-alignment process, and thus hard to reduce the size of the device.

BRIEF SUMMARY OF THE INVENTION

Various embodiments of the present invention are directed to providing a method for manufacturing a semiconductor device that comprises a tunneling field effect transistor, thereby simplifying a process accompanied by manufacturing an asymmetric device in forming a TFET structure.

According to one aspect of an exemplary embodiment, a method for manufacturing a semiconductor device comprises: forming a conductive pattern over a semiconductor substrate; implanting impurity ions with the conductive pattern as a mask to form a first junction region in the semiconductor substrate; forming a first insulating film planarized with the conductive pattern over the first junction region; etching the top side of the conductive pattern to expose a sidewall of the first insulating film; forming a spacer at the sidewall of the first insulating film disposed over the conductive pattern; etching the conductive pattern with the spacer as an etching mask to form a gate pattern; and forming a second junction region in the semiconductor substrate with the gate pattern as a mask.

The semiconductor substrate is a Silicon-On-Insulator (SOI) substrate including a lower silicon layer, an insulating layer and an upper silicon layer.

The method further comprises forming a gate insulating film over the semiconductor substrate before forming the conductive pattern.

The forming a conductive pattern includes: forming a polysilicon layer over the semiconductor substrate; and etching the polysilicon layer to expose the semiconductor substrate.

The forming a polysilicon layer n+ type impurities are implanted into the polysilicon layer.

The forming a first junction-region is performed by implanting n− type ions.

The first junction region is a drain region.

The first junction region is formed in the upper silicon layer.

The forming a first insulating film includes: forming an insulating material over the top portion of the semiconductor substrate including the conductive pattern; and performing a planarizing process to expose the conductive pattern.

The etching the top side of the conductive pattern is performed by a dry etching process.

The forming a spacer the spacer is formed with a material including silicon nitride.

The forming a second junction region is performed by implanting p+ type ions.

The second junction region is a source region.

The second junction region is formed in the upper silicon layer.

After forming a second junction region, the method further comprises: forming a second insulating film over the top portion of the semiconductor substrate including the spacer, the gate pattern and the first insulating film; planarizing the second insulating film; etching the first insulating film and the second insulating film to form a contact hole that exposes the first junction region and the second junction region; burying a conductive material in the contact hole to form a contact plug; and forming a metal line connected to the contact plug.

According to another aspect of an exemplary embodiment, a method for manufacturing a semiconductor device comprises: forming a n-type polysilicon pattern over a SOI substrate; implanting n-type impurities with the n-type polysilicon pattern to form a drain region; forming a first insulating film planarized with the n-type polysilicon pattern over the drain region; etching the top side of the n-type polysilicon pattern; forming a spacer at a sidewall of the first insulating film disposed in the etched top portion of the n-type polysilicon pattern; etching the n-type polysilicon pattern with the spacer as a mask to form a gate pattern; and implanting p-type impurities with the gate pattern as a mask to form a source region.

The method further comprises forming a gate insulating film over the SOI substrate before forming an n-type polysilicon pattern.

The method further comprises: forming a second insulating film over the top portion of the SOI substrate including the spacer, the gate pattern and the first insulating film; planarizing the second insulating film; etching the first insulating film and the second insulating film to form a contact hole that exposes the first junction region and the second junction region; burying a conductive material in the contact hole to form a contact plug; and forming a metal line connected to the contact plug.

According to another aspect of an exemplary embodiment, a method for manufacturing a semiconductor device, the method comprising: forming a first gate pattern over a substrate; forming a first junction region in the substrate using the first gate pattern as a mask; forming a spacer pattern over the first gate pattern; and forming a second junction region using the spacer pattern as a mask.

The method further comprising the first gate pattern using the spacer pattern to form a second gate pattern, wherein the second junction region is formed using the spacer pattern and the second gate pattern as a mask.

The method further comprising the first gate pattern has a first polarity, and wherein the second junction region has a second polarity.

The method further comprising the first junction region has the first polarity.

The method further comprising: the second junction region is configured to activate tunneling between the first gate pattern and the second junction region when a threshold voltage is applied to the first gate pattern, and wherein the second junction region is configured to inactivate tunneling between the first gate pattern and the second junction region when the threshold voltage is not applied to the first gate pattern.

The method further comprising the first gate pattern is doped with n-type ions at a first concentration level, wherein the second junction region is doped with p-type ions at a second concentration level, and wherein the first and the second concentration levels are (i) configured to activate tunneling between the first gate pattern and the first junction region when a threshold voltage is applied to the first gate pattern, and (ii) further configured to inactivate tunneling between the first gate pattern and the first junction region when the threshold voltage is not applied to the first gate pattern.

The method further comprising the substrate is a Silicon On Insulator (SOI) substrate.

The method further comprising the semiconductor device comprises a Tunneling Field Effect Transistor (FFET).

The method further comprising wherein the first junction region is coupled to the second junction region through the first gate pattern.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Exemplary embodiments of the present invention will be described in detail with reference to the attached drawings.

FIGS. 2a to 2h are cross-sectional diagram illustrating a method for manufacturing a semiconductor device according to an embodiment of the present invention.

Figure 1:
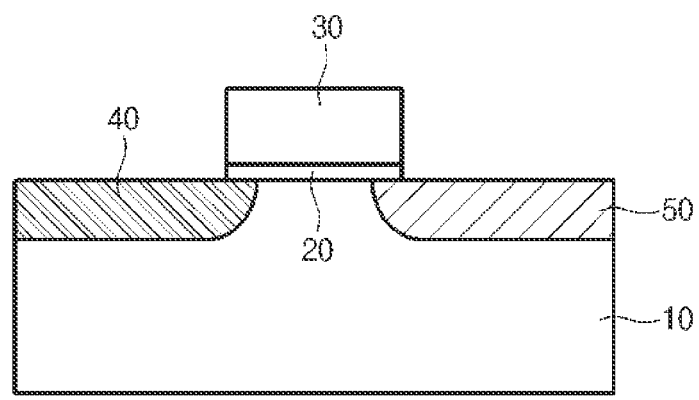
FIG. 1 is a cross-sectional diagram illustrating a general semiconductor device.
Figure 2A:
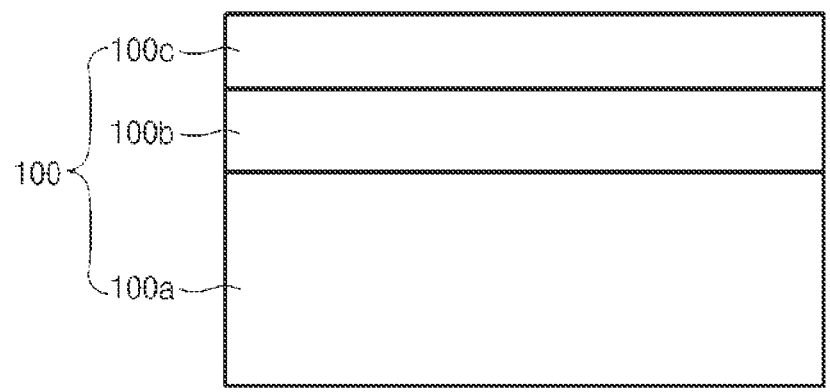
FIGS. 2a to 2h are cross-sectional diagrams illustrating a method for manufacturing a semiconductor device according to an embodiment of the present invention.

Referring to FIG. 2a, a Silicon-On-Insulator (SOI) substrate 100, including a lower silicon layer 100a, an insulating layer 100b, and an upper silicon layer 100c, is provided.

The lower silicon layer 100a is doped with p-type impurities and a voltage of about −0.8V is applied to the lower silicon layer 100a in the operation of the semiconductor device. The insulating layer 100b insulates the lower silicon layer 100a from the upper silicon layer 100c. The upper silicon layer 100c, which is disposed over the insulating layer 100b, is formed to have a thickness about 1000 Å or less. In a conventional method, a bulk silicon substrate is used to make a barrier film by performing ion-implantation into a lower portion of an active region to prevent a punch through phenomenon. When a SOI substrate is used, the number of process steps can be reduced compared with the conventional manufacturing method.

A thinning process is performed to make the thickness of the upper silicon layer 100c of the SOI substrate 100 thin. The thinning process may be performed by thermally oxidizing the upper silicon layer 100c and removing the oxidized upper silicon layer 100c using a Chemical Mechanical Polishing (CMP) process.

Figure 2B:
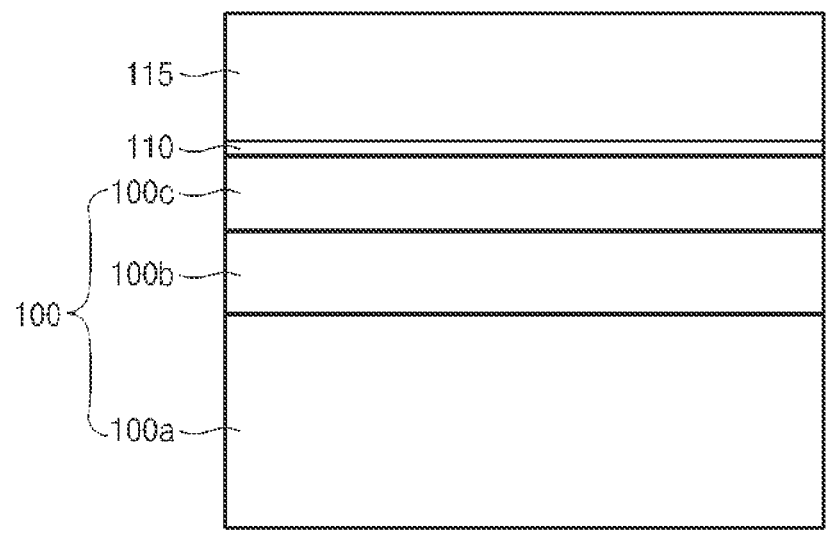

Referring to FIG. 2b, a gate insulating film 110 is formed over the SOI substrate 100. The gate insulating film 110 may include an oxide film formed by a thermal oxidation process. A conductive layer 115 is formed over the gate insulating film 110. The conductive layer 115 includes a doped polysilicon, preferably, a polysilicon doped with n+ ions.

Figure 2C:
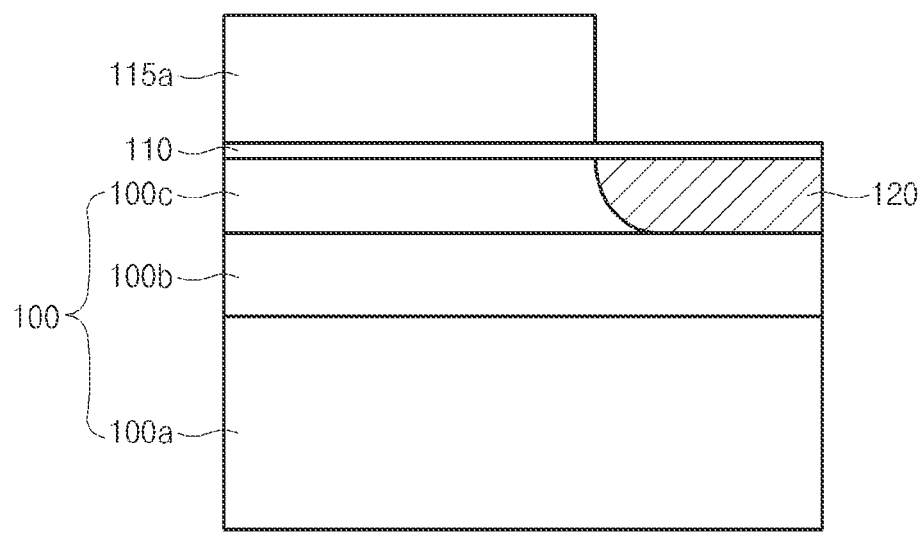

Referring to FIG. 2c, a mask pattern (not shown) that defines a junction region is formed over the conductive layer 115. Referring to FIG. 2c, the conductive layer 115 is etched with the mask pattern (not shown) as an etch mask to form a conductive pattern 115a that exposes the gate insulating film 110 of the junction region. Then, the mask pattern (not shown) is removed. Using the conductive pattern 115a as a mask, n-type impurity ions are implanted to form a first junction region 120 in the upper silicon layer 100c of the SOI substrate 100. The first junction region 120 is a drain region. The n-type impurity ions refer to n-type impurities that are ion implanted with low concentration. However, in an embodiment, the first junction region 120 may be a p− doping layer. When the first junction region 120 is doped with p-type impurities, the conductive layer 115 is doped with n type impurities.

Figure 2D:
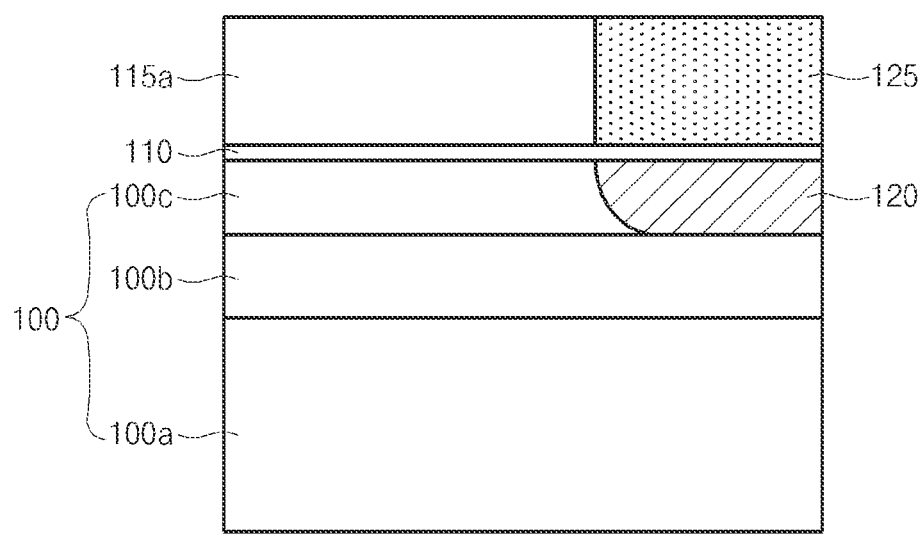

Referring to FIG. 2d, an insulating material is formed over the top portion of the SOI substrate 100 including the first junction region 120 and the conductive pattern 115a. A planarizing process is performed to expose the top portion of the conductive pattern 115a, thereby forming a first insulating film 125. In an embodiment, the first insulating film 125 may be substantially level with the conductive pattern 115a. The first insulating film 125 may be formed with an oxide film, e.g., a TEOS film. Since the TEOS film would serve as a hard mask in etching polysilicon material to form the conductive pattern 115a, it is desirable to use a TEOS film that has a large etch selectivity difference from that of the polysilicon material.

Figure 2E:
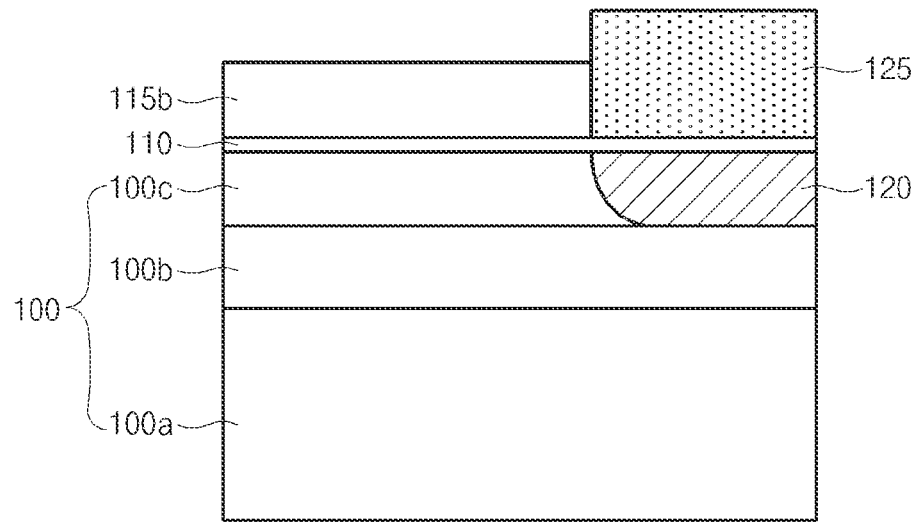

Referring to FIG. 2e, the conductive pattern 115a is etched, forming conductive pattern 115b, to expose a portion of a sidewall of the first insulating film 125. The etching of the conductive pattern 115b is performed by a dry etch process.

Figure 2F:
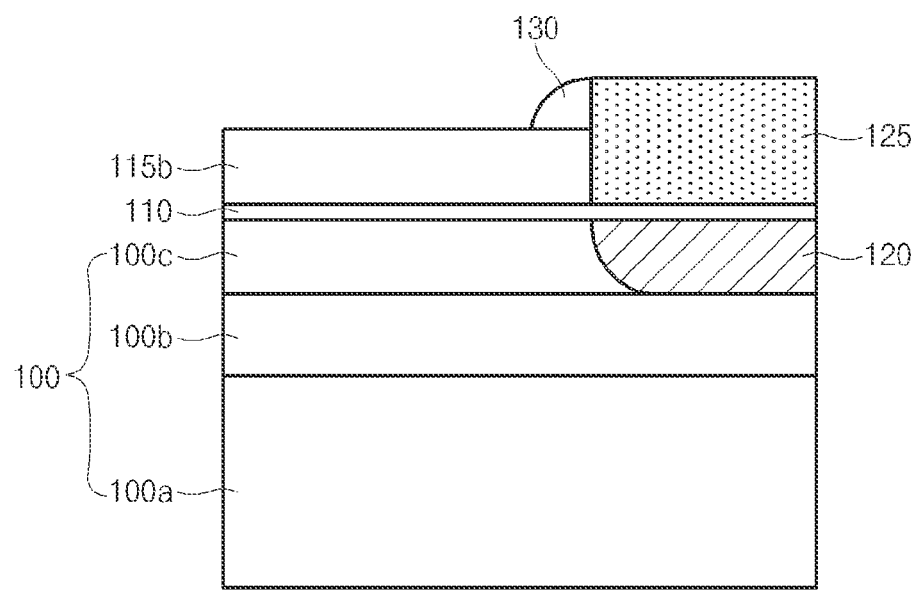

Referring to FIG. 2f, a spacer material (not shown) is formed over the SOI substrate 100 including the conductive pattern 115b and the first insulating film 125. In an embodiment, the spacer material may be a silicon nitride film $Si_3N_4$. It is desirable to form the silicon nitride film $Si_3N_4$ along the step difference of the conductive pattern 115b and the first insulating film 125. A dry etch process is performed to form a spacer 130 at the sidewall of the first insulating film 125. The width of the spacer 130 may be adjusted according to the line-width of a gate to be formed in a subsequent process.

Figure 2G:
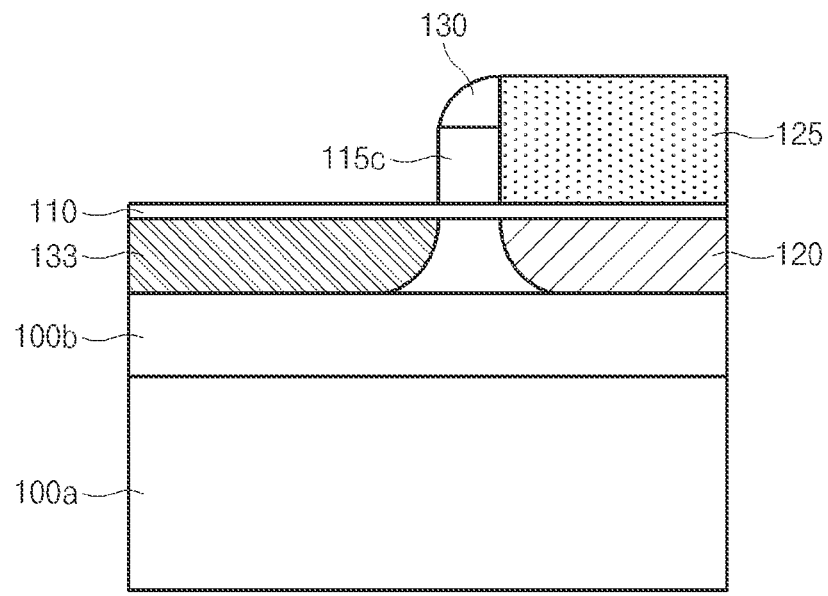

Referring to FIG. 2g, with the spacer 130 as an etch mask, the conductive pattern 115b is etched to form a gate pattern 115c and to expose a portion of the gate insulating film 110, which is disposed in a region where a second junction region will be formed. With the spacer 130 and the gate pattern 115c as masks, p+ type impurity ions are implanted to form a second junction region 133 in the upper silicon layer 100c of the SOI substrate 100. The second junction region 133 is a source region, and the p+ type impurity ions refer to p-type impurities that are ion implanted with a high concentration. In an embodiment, the impurity ions implanted into the second junction region 133 may be n-type impurities. When the second junction region 133 is an n+ doping layer, the gate pattern 115c and the first junction region 120 are formed of p doping layers.

Figure 2H:
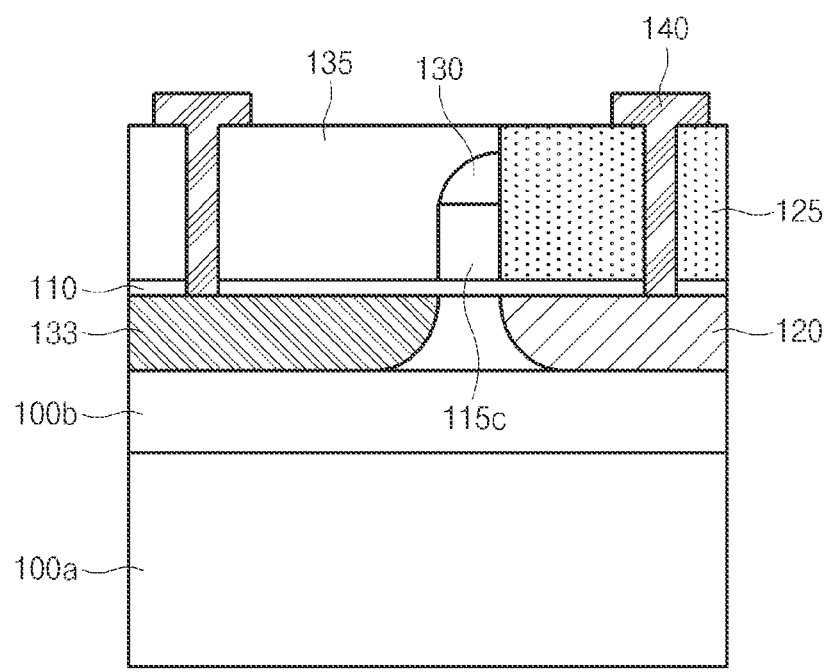

Referring to FIG. 2h, a second insulating film 135 is formed over the SOI substrate 100, including the gate pattern 115c and the first insulating film 125, and planarized by a CMP process. The first insulating film 125 and the second insulating film 135 are etched to form contact holes that expose the first junction region 120 and the second junction region 133, respectively. The contact holes are filled with conductive material to form contact plugs 140. A metal line (not shown) connected to the contact plugs 140 is formed.

To further explain the advantages of the present invention, as illustrated by the embodiments described above, features of the present invention will be discussed further. According to an embodiment of the present invention, a first gate pattern is formed over a substrate. A first junction region is formed in the substrate using the first gate pattern as a mask. The first gate pattern may be used as an implant mask to implant ions into the substrate to form the first junction region. A spacer pattern is then formed over the first gate pattern.

Next, a second junction region is formed using the spacer pattern as a mask. The spacer pattern may be used as an implant mask to implant ions having a different polarity from the ions used to form the first junction region into the substrate to form the second junction region.

In an embodiment, the first gate pattern may be patterned using the spacer pattern to form a second gate pattern. Then, the second junction region is formed using the spacer pattern and the second gate pattern together as a mask. The first junction region is coupled to the second junction region through the first gate pattern.

The first gate pattern is formed to have a first polarity, and the second junction region is formed to have a second polarity that is different from the first polarity. In an embodiment, the first junction region may have the first polarity.

When a threshold voltage is applied to the first gate pattern, the second junction region is configured to activate tunneling between the first gate pattern and the second junction region. In contrast, when the threshold voltage is not applied to the first gate pattern, the second junction region is configured to inactivate tunneling between the first gate pattern and the second junction region.

The first gate pattern may be doped with n-type ions at a first concentration level, and the second junction region may be doped with p-type ions at a second concentration level. The first and the second concentration levels are adjusted so as to (i) activate tunneling between the first gate pattern and the first junction region when a threshold voltage is applied to the first gate pattern, and (ii) inactivate tunneling between the first gate pattern and the first junction region when the threshold voltage is not applied to the first gate pattern.

In an embodiment, the substrate may be a Silicon On Insulator (SOI) substrate. The semiconductor device may comprise a Tunneling Field Effect Transistor (FFET).

As described above, the method for manufacturing a semiconductor memory device according to an embodiment of the present invention may simplify a process for manufacturing an asymmetric TFET device.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method for manufacturing a semiconductor device, the method comprising:
   forming a conductive pattern over a semiconductor substrate;
   implanting impurity ions using the conductive pattern as a mask to form a first junction region in the semiconductor substrate;
   forming a first insulating film so as to level with the conductive pattern over the first junction region;
   etching an upper portion of the conductive pattern to expose a sidewall of the first insulating film;
   forming a spacer at the sidewall of the first insulating film disposed over the conductive pattern;
   etching the conductive pattern using the spacer as an etch mask to form a gate pattern; and
   forming a second junction region in the semiconductor substrate using the gate pattern and the spacer as a mask.

2. The method according to claim 1, wherein the semiconductor substrate is a Silicon-On-Insulator (SOI) substrate including a lower silicon layer, an insulating layer, and an upper silicon layer.

3. The method according to claim 1, the method further comprising forming a gate insulating film between the semiconductor substrate and the conductive pattern.

4. The method according to claim 1, wherein the forming the conductive pattern includes:
   forming a polysilicon layer over the semiconductor substrate; and
   etching the polysilicon layer to expose a part of the semiconductor substrate.

5. The method according to claim 4, wherein, in the forming the polysilicon layer, n type impurities are implanted into the polysilicon layer.

6. The method according to claim 1, wherein the forming the first junction region is performed by implanting n type ions.

7. The method according to claim 1, wherein the first junction region is a drain region.

8. The method according to claim 2, wherein the first junction region is formed in the upper silicon layer.

9. The method according to claim 1, wherein the forming the first insulating film includes:
   forming an insulating material over the top portion of the semiconductor substrate including the conductive pattern; and
   performing a planarizing process to expose the conductive pattern.

10. The method according to claim 1, wherein the etching the upper portion of the conductive-pattern is performed by a dry etching process.

11. The method according to claim 1, wherein, in the forming the spacer, the spacer is formed with a material including silicon nitride.

12. The method according to claim 5, wherein the forming the second junction region is performed by implanting p type ions.

13. The method according to claim 1, wherein the second junction region is a source region.

14. The method according to claim 2, wherein the second junction region is formed in the upper silicon layer.

15. The method according to claim 1, the method further comprising, after forming a second junction region:
   forming a second insulating film over the top portion of the semiconductor substrate including the spacer, the gate pattern, and the first insulating film;
   planarizing the second insulating film;
   etching the first insulating film and the second insulating film to form contact holes that expose the first junction region and the second junction region;
   filling the contact holes with a conductive material to form contact plugs; and
   forming metal lines coupled to the contact plugs.

16. A method for manufacturing a semiconductor device, the method comprising:
   forming an n-type polysilicon pattern over a SOI substrate;
   implanting n-type impurities to form a drain region using the n-type polysilicon pattern as a mask;
   forming a first insulating film planarized with the n-type polysilicon pattern over the drain region;
   etching an upper portion of the n-type polysilicon pattern;
   forming a spacer at a sidewall of the first insulating film, wherein the spacer is disposed over the etched n-type polysilicon pattern;
   etching the n-type polysilicon pattern using the spacer as a mask to form a gate pattern; and
   implanting p-type impurities using the gate pattern as a mask to form a source region.

17. The method according to claim 16, the method further comprising forming a gate insulating film over the SOI substrate before forming the n-type polysilicon pattern.

18. The method according to claim 16, the method further comprising:
   forming a second insulating film over the SOI substrate including the spacer, the gate pattern, and the first insulating film;
   planarizing the second insulating film;
   etching the first insulating film and the second insulating film to form contact holes that expose the first junction region and the second junction region;
   burying conductive material in the contact holes to form contact plugs; and
   forming a metal line coupled to the contact plugs.

* * * * *